United States Patent

Delalle et al.

[11] Patent Number: 5,086,967
[45] Date of Patent: Feb. 11, 1992

[54] SOLDER CONNECTION DEVICE

[76] Inventors: Jacques Delalle, 36 rue du General Gallieni, 78510-Triel Sur Siene; Mahrez Ouaniche, 19 rue du Commerce, 95610 Eragny; Michele Lamothe, 16 Villa Cheuvreuse, 92140 Clamart; Frederic Passa, 8 les Dix Arpents Ocres, 95610 Eragny; Philippe Roucaute, 100 rue Henri Barbusse, 60230 Chambly, all of France

[21] Appl. No.: 610,730
[22] PCT Filed: Apr. 29, 1988
[86] PCT No.: PCT/GB88/00335
  § 371 Date: Jan. 2, 1990
  § 102(e) Date: Jan. 2, 1990
[87] PCT Pub. No.: WO88/09068
  PCT Pub. Date: Nov. 17, 1988

Related U.S. Application Data

[63] Continuation of Ser. No. 435,381, Jan. 2, 1990, abandoned.

[30] Foreign Application Priority Data

May 2, 1987 [GB] United Kingdom ............... 8710489

[51] Int. Cl.$^5$ ........................ H01R 4/72; B23K 3/00
[52] U.S. Cl. ............................... 228/56.3; 228/246
[58] Field of Search ............ 228/56.3, 245, 246, 228/57; 29/859, 868; 174/DIG. 8; 439/932

[56] References Cited

U.S. PATENT DOCUMENTS

| | | | |
|---|---|---|---|
| 1,248,506 | 12/1917 | Lavine | 228/56.3 |
| 2,503,564 | 4/1950 | Reeve | 228/56.3 |
| 3,305,625 | 2/1967 | Ellis | 228/56.3 |
| 3,384,951 | 5/1968 | Binger | 29/495 |
| 3,464,617 | 9/1969 | Raynes et al. | 228/56.3 |
| 3,525,799 | 8/1970 | Ellis | 228/56.3 |
| 3,957,382 | 5/1976 | Gruel et al. | 403/27 |
| 4,431,465 | 2/1984 | Mizuhara et al. | 148/24 |
| 4,722,471 | 2/1988 | Gray et al. | 228/56.3 |
| 4,832,248 | 5/1989 | Soni et al. | 228/56.3 |
| 4,896,904 | 1/1990 | Gadsden et al. | 174/DIG. 8 |

FOREIGN PATENT DOCUMENTS

| | | |
|---|---|---|
| 7123387U | 10/1972 | Fed. Rep. of Germany . |
| 734195 | 4/1928 | United Kingdom . |
| 400817 | 11/1933 | United Kingdom . |
| 282007 | 7/1955 | United Kingdom . |

OTHER PUBLICATIONS

Raychem Specification Control Drawing TSN 75 TA 07/29, 06, Sep. 1982.

*Primary Examiner*—Samuel M. Heinrich
*Attorney, Agent, or Firm*—Edith A. Rice; Herbert G. Berkard

[57] ABSTRACT

A device for froming a solder connection between a plurality of elongate bodies comprises a dimensionally recoverable article, e.g. a heat-shrinkable sleeve, into which the bodies can be inserted, and a solder insert. The solder insert comprises two portions, one formed from a relatively low melting point solder for forming a solder joint between the bodies, and the other portion being formed from a relatively high melting point solder. When the device is heated the relatively high melting point solder will not melt until the low melting point solder has melted and flowed, and therefore provides a means for indicating that the correct temperature has been reached.

14 Claims, 3 Drawing Sheets

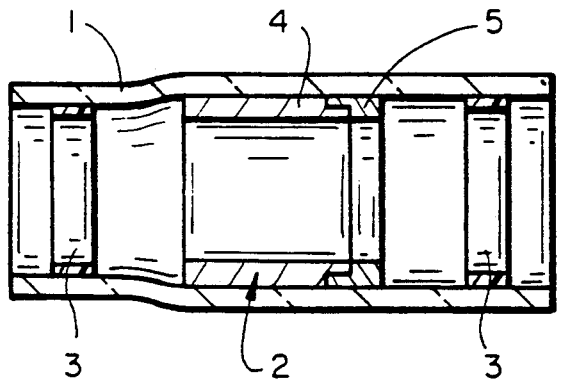
FIG_1
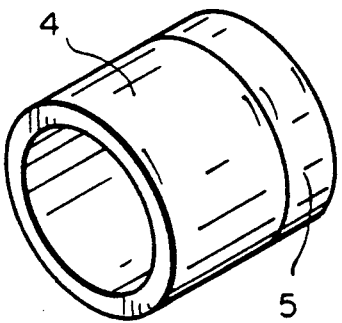
FIG_2
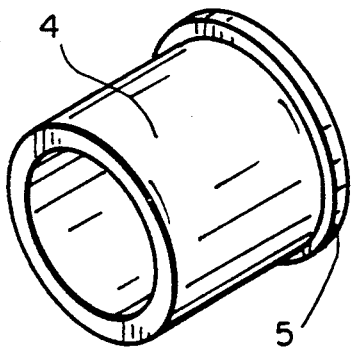
FIG_3

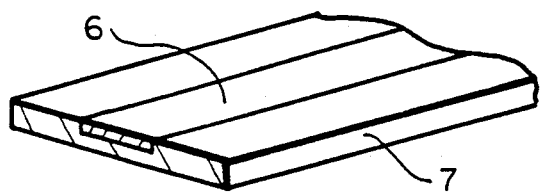
FIG_4
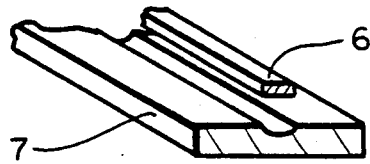
FIG_5a
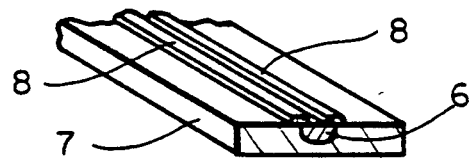
FIG_5b
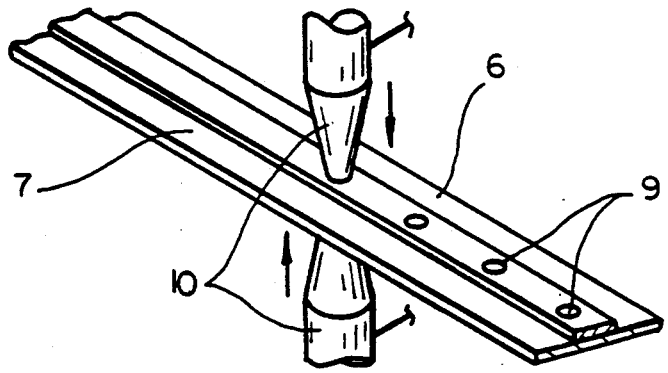
FIG_6

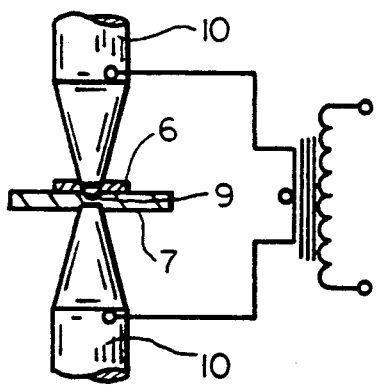
FIG_7
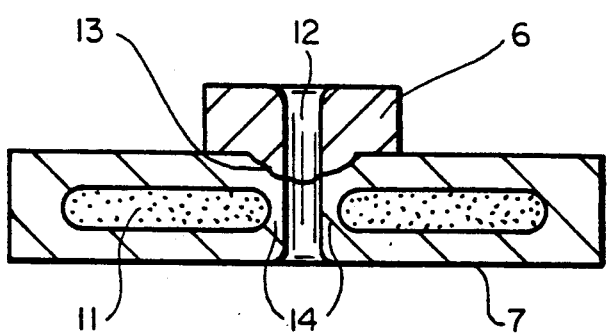
FIG_8
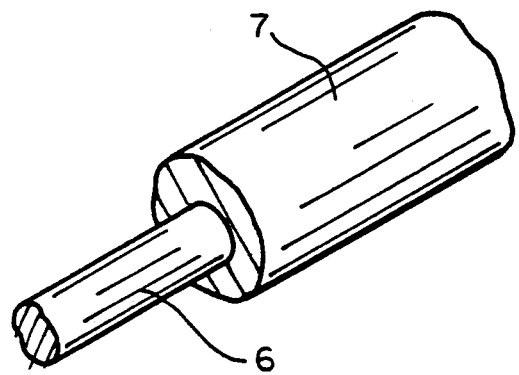
FIG_9

SOLDER CONNECTION DEVICE

This application is a continuation of application Ser. No. 07/435,381 filed Jan. 2, 1990, now abandoned.

This invention relates to devices for forming solder connections for example electrical connections between electrical conductors or mechanical connections between pipes and other equipment. In particular the invention relates to such devices that are dimensionally heat-recoverable.

Heat-recoverable articles are articles the dimensional configuration of which may be made substantially to change when subjected to heat treatment.

Usually these articles recover, on heating, towards an original shape from which they have previously been deformed but the term "heat-recoverable", as used herein, also includes an article which, on heating, adopts a new configuration, even if it has not been previously deformed.

In their most common form, such articles comprise a heat-shrinkable sleeve made from a polymeric material exhibiting the property of elastic or plastic memory as described, for example, in U.S. Pat. Nos. 2,027,962; 3,086,242 and 3,597,372. As is made clear in, for example, U.S. Pat. No. 2,027,962, the original dimensionally heat-stable form may be a transient form in a continuous process in which, for example, an extruded tube is expanded, while hot, to a dimensionally heat-unstable form but, in other applications, a preformed dimensionally heat-stable article is deformed to a dimensionally heat-unstable form in a separate stage.

In the production of heat-recoverable articles, the polymeric material may be cross-linked at any stage in the production of the article that will enhance the desired dimensional recoverability. One manner of producing a heat-recoverable article comprises shaping the polymeric material into the desired heat-stable form, subsequently cross-linking the polymeric material, heating the article to a temperature above the crystalline melting point or, for amorphous materials the softening point, as the case may be, of the polymer, deforming the article and cooling the article while in the deformed state so that the deformed state of the article is retained. In use, since the deformed state of the article is heat-unstable, application of heat will cause the article to assume its original heat-stable shape.

In other articles, as described, for example, in British Patent 1,440,524, an elastomeric member such as an outer tubular member is held in a stretched state by a second member, such as an inner tubular member, which, upon heating weakens and thus allows the elastomeric member to recover.

Heat-recoverable articles have become widely used for forming solder connections between electrical conductors in view of the ease of forming the connection and the quality of the connection so formed. For such applications the article, usually in the form of a sleeve, contains a quantity of solder for forming the electrical connection and a pair of fusible inserts for sealing the connection. These articles are described for example in U.S. Pat. Nos. 3,243,211, 4,282,396 and 4,283,596, and British Patent No. 1,470,049 the disclosures of which are incorporated herein by reference, and are sold by Raychem Corporation, Menlo Park, Calif. under the trade mark "SOLDER SLEEVE" amongst others.

Although such devices are satisfactory for many applications, in certain instances the quality of the connection formed may depend signifcantly on the skill of the installer, and, in particular, the devices may be sensitive to underheating or overheating or both. This may result in unreliable connections, or damage to the sleeve of the device or the insulation surrounding the conductors to be connected. In other fields of application, for example when mechanical joints are being formed, the existing devices may be unsuitable in view of poor or unreliable substrate penetration of the solder.

These problems have been overcome by means of the device described in our European patent application No. 172,072 which uses solder inserts formed from different solder materials. However such devices have proved difficult to manufacture because of the additional solder inserts required which must be installed in the correct order and position.

According to one aspect, the present invention provides a device for forming a solder connection between a plurality of elongate bodies, which comprises a dimensionally recoverable article into which part of the bodies can be inserted, the article containing a composite solder insert having a portion that is formed from a relatively low melting point solder for forming a solder joint between the bodies, and a portion that is formed from a relatively high melting point solder which, when the device is heated in use, will not melt until after the relatively low melting point solder has melted and flowed.

According to another aspect, the invention provides a composite solder insert suitable for insertion into a solder connection device, which has a portion that is formed from a relatively low melting point solder and a portion that is formed from a relatively high melting point solder that will not melt, when the composite insert is heated, until after the relatively low melting point solder has melted and flowed.

The term "solder" as used herein includes both conventional metallic solder and solder adhesives in which a hot-melt adhesive, e.g. a polyamide hot-melt adhesive, or a thermosetting adhesive such as an epoxy adhesive, is filled with metal particles, e.g. with silver flake. In most cases, however, the solder inserts will be formed from conventional metallic solder.

Since only one solder insert need be used in the manufacture of the solder connection device, the device can be made simply and quickly using conventional solder device assembly equipment.

The two portions of the composite solder insert may be joined together by any of a number of means. For example they may be bonded together for example by means of an adhesive, or they may be soldered together, either by means of a third solder material or by means of the same solder as is used to form either of the two portions of the device. Alternatively the solder portions may be bonded together by cold working. This may be achieved for example in the case of an annular insert by a stamping operation in which one portion, e.g. in the form of a collar, is bonded to the second portion in the form of an annular flange as the second portion is stamped out of a blank sheet. Another method of cold working the two portions together that may be used to form the composite solder insert is a cold rolling method in which two or more strips of solder material, including at least one strip each of the high and low melting point solder are juxtaposed or overlapped, or one is placed upon the other, and then rolled to bond the strips together. The composite strip so formed can then be cut to length and the cut lengths wrapped around an appropriately shaped mandrel to form a wrapped solder insert or may be wrapped around the mandrel and then cut to length. Yet another method of forming the composite insert includes forming separate appropriately shaped inserts and then press fitting inserts formed from different solder material together.

Whichever form of composite insert is used, it is preferred that the individual, discrete, portions formed from a least one of the solder materials are formed only at the same time as the composite solder insert is formed. That is to say, the composite insert is preferably formed by an operation that does not involve the prior formation of discrete solder portions of both solder materials. Such operations have the advantage that not more than one type of individual solder insert is employed at any one time, with considerable simplification of the handling of the solder. Examples of such operations include cold rolling of solder strips followed by chopping and wrapping the strips, and stamping operations in which one portion is stamped out of a blank sheet at the same time as it is bonded to the other portion.

The insert is preferably formed from a strip of solder that is formed into an appropriate shape for the solder device, for example by wrapping it around a mandrel. When forming this type of insert it is often necessary for the two strips of solder that make up the composite strip to be attached together by some means at least until the discrete composite insert has been formed. Often, for example where one solder strip is positioned in a groove in the other solder strip the two strips will be retained together by their shape when the strip has been wrapped round the mandrel to form the discrete device. The insert is preferably formed in such a way that no material is present in the insert other than solder or flux, or that, at most, only an insignificant quantity of such material is present. This form of solder insert may be formed in a number of ways: the two different solder strips may be assembled together with no adhesive to form a composite solder strip, and then the strips may be stuck together by means of a removable adhesive applied to the surface only of the composite strip. After the strip has been wrapped around the mandrel to form the composite insert, so that the adhesive is no longer necessary, the adhesive may be removed, e.g. by heat or infrared radiation or by application of an appropriate solvent, and the manufacturing process may be continued in the conventional manner. Alternatively the two strips of solder may be held together by means of an adhesive coated paper layer that can be peeled away from the composite strip just prior to wrapping the strip about the mandrel. In other forms of strip, the two quantities of solder may be bonded to one another by means of the flux that is incorporated in the solder or may in this case be coated on the surface of one of the strips. Yet another form of device uses a volatile adhesive which forms a temporary bond between the two quantities of solder but which disappears when the heat shrinkable sleeve is partially recovered about the solder strip during manufacture of the connector device.

In another form of device the two strips of solder may be welded together for example by an electrical welding method in which a pair of electrodes is pressed against opposite sides of the composite solder strip and a current is passed through the composite strip that welds the strips together by joule heating. In yet another form of device the two strips are joined together by a train of laser welds in which a laser is fired at a spot on the strip and forms a hole through the composite strip and, at the same time, bonds the two strips together. This form of joining the strips together has the advantage that it is very rapid, and that a number of small holes are formed in the insert through which solder can flow when the device is heated. A further form of device can incoporate an insert that has been formed from a co-extruded strip of solder.

The composite solder strip is novel per se and accordingly the invention further provides a composite solder strip which comprises a plurality of strips of solder, at least one such strip being formed from a relatively low melting point solder and at least one other such strip being formed from a relatively high melting point solder, the strips being secured together at least temporarily. This form of solder strip may be used to form inserts for a solder device described above, or it may be employed for hand soldering in which case the high melting point solder will not allow low temperature solder to be fed into the joint until the temperature is high enough.

In yet another aspect of the invention the high-temperature solder may be in the form of a plurality of particles dispersed within the low-temperature solder. For example the low-temperature solder may be in the form of a solder paste with particle sizes in the range of about 0.1 to 10 μm and containing 2 to 5% by weight flux. Into the low-temperature solder paste a quantity of balls of high-temperature solder are dispersed. The diameter of the high-temperature solder balls is larger than the diameter of the solder paste particles, for example the high-temperature solder balls may have a diameter in the range of 0.1 to 3 mm, and especially from 0.3 to 1.5 mm while the solder paste particles will usually have too small a size to identify individual particles with the naked eye. Usually the solder composite will contain up to 50%, preferably up to 30% high-temperature solder balls, and most usually from 0.1 to 10% high temperature solder balls. The composite solder paste may be used alone to form solder joints between two substrates or it may be used within a heat-shrinkable sleeve as described above to form a solder connector device that can form an insulated joint between two elongate substrates. On recovery of the sleeve the solder balls will give it an undulating surface, and smoothening of the surface, signifying that the high-temperature solder balls have melted, will indicate that the sleeve has been heated sufficiently.

Another method in which the composite insert can be formed without the prior formation of discrete solder portions is one in which the insert is formed from compacted, preferably sintered solder powders. Thus, for example, the low or high melting point solder powder may be placed in a mold and sintered under pressure, and then the other solder powder may be added to the same mold and itself sintered under pressure and at a temperature of up to 150° C. to sinter both powders together.

Preferably the temperature difference between the first and second insert points is at least 10°, more preferably at least 20° and especially at least 40° C. but preferably not more than 120°, more preferably not more than 90° and especially not more than 70° C. The two solder materials may be formed from eutectic compositions having different melting points, for example one portion of the insert may be formed from a 63% Sn/37%Pb eutectic and the second from a 96.5% Sn/3.5% Ag eutectic, or it may be formed from a eutectic composition, e.g. a 63% Sn/37% Pb composition while the second is formed from a non-eutectic composition, e.g. 50% Sn/50% Pb. In the latter case, although the second portion will begin to melt at the melting point of the lower melting point solder, it will then go through a "pasty" phase as the temperature rises until it is fully molten, and, during part of the "pasty" phase, will act as a barrier to the fused lower melting point solder. Preferably, however, the second solder portion is formed from a eutectic composition in order to provide a prompt indication that sufficient heat has been applied to the device.

The presence of the higher melting point solder will often, depending on the design, control the extent to which the molten lower melting point solder can flow along the bodies in at least one the directions. This control of the flow of the lower melting point solder has a number of advantages depending on the application. For example it will prevent fused solder from flowing or "squirting" out of the end of the device if the device is overheated, and so prevent damage by the hot solder to the insulation surrounding the bodies in the case of insulated wires and also prevent the formation of an electrically conductive path between the interior and the exterior of the device.

In addition or alternatively the high melting point solder portion may act as a temperature indicator to indicate that sufficient heat has been applied to the article. Thus, when the article is heated the article attempts to recover about the elongate objects but the central region is prevented from recovering by the presence of the underlying solder insert. As heating is continued, the low melting point portion of the composite insert melts and flows around the elongate objects. By the time the higher melting point portion melts, as evidenced by the change in the outer profile of the article, the installer can stop the heating of the article since melting and flowing of the low melting point solder has been guaranteed.

Several forms of solder insert and connection device according to the present invention will now be described by way of example with reference to the accompanying drawings in which:

FIG. 1 is an axial section through a solder connection device according to the invention;

FIG. 2 is a perspective view of the composite solder insert of FIG. 1;

FIG. 3 is a perspective view of another form of composite solder insert;

FIG. 4 is a perspective view of part of a further solder insert during manufacture;

FIG. 5 is a schematic view of another form of composite solder strip according to the invention during manufacture;

FIGS. 6 and 7 are schematic views showing the manufacture of yet another form of composite solder strip according to the invention;

FIG. 8 is a cross-sectional view through yet another form of composite solder strip; and FIG. 9 is an isometric view of a further form of composite solder strip.

Referring to the accompanying drawings, FIGS. 1 and 2 show a solder connection device according to the present invention, which comprises a hollow, open-ended transparent heat-shrinkable sleeve 1, preferably formed from crosslinked polyvinylidine fluoride. Inside the sleeve 1 is a composite solder insert 2 and a pair of uncrosslinked polyethylene sealing rings 3 for forming an environmental seal to the bodies, e.g. electrical wires or coaxial cables to be enclosed.

The composite solder insert comprises a main portion 4 formed from a low melting point solder alloy, e.g. a 63% Sn/37% Pb eutectic alloy which melts at 183° C. The composite solder insert has an edge portion 5 that is formed from a relatively high melting point solder material, e.g. a 96% Sn/4% Ag eutectic solder which melts at 220° C. The two portions have a lapjoint region 6 in which each portion has an overlapping flange of half the wall thickness. This form of composite solder insert may be formed by manufacturing the separate components and then push-fitting them together or by stamping if annular composite inserts are required. Alternatively strips of the different solder material may be cold rolled together and then chopped and wrapped around a mandrel to form a wrapped insert.

FIG. 3 shows a similar form of solder insert as that shown in FIG. 2 in which a short tube or collar 4 of 63% Sn/37% Pb solder has been joined to a ring of 96% Sn/4% Ag solder by a stamping process at the same time as the ring 5 is stamped out of the solder blank.

FIG. 4 shows a composite strip of solder during manufacture of a composite solder insert. In one form of device a central strip 6 of high melting point (96% Sn/4% Ag) solder is cold rolled with a larger strip 7 of low melting point (63% Sn/37% Pb) solder so that the strip 7 is located on both sides of strip 6. This strip may then be chopped into discrete lengths and wrapped with the high melting point solder strip 6 facing outwards. Alternatively the composite insert may be formed with the central strip 6 formed from the lower melting point solder and facing outwards so that the portions of the larger strip 7 of higher melting point solder lying on each side of the central strip 6 act as barriers to prevent fused low melting point solder squirting out of the article when the article is heated. If desired the larger strip 7 may be formed from a low melting point non-eutectic alloy e.g. $Sn_{48}Pb_{42}Bi_{10}$ while the central strip is formed from a higher melting point eutectic alloy e.g. $Sn_{63}Pb_{37}$.

FIG. 5 shows schematically the steps in the manufacture of a solder device that employs an insert from a wrapped composite strip. As shown in FIG. 5 the strip comprises a major strip 7 of low melting point solder, e.g. Sn63/Pb37 and a minor strip 6 of high melting point solder e.g. Sn96/Ag4 which are held together by means of a small quantity 8 of a watersoluble and/or cyanoacrylate adhesive.

After the composite strip has been wrapped around a mandrel and cut to form an insert for a solder connection device it can be briefly heated, for example by means of an infrared heater to remove the layer 8 of adhesive before it is inserted into a polyvinylidine fluoride sleeve to form the device.

FIGS. 6 and 7 show schematically an alternative method of attaching the strip 6 of high melting point solder to the strip 7 of low melting point adhesive in which a high current is passed through the composite strip periodically by means of electrodes 10 in order to form welds 9 between the high and low melting point solders.

FIG. 8 is a cross-section through a composite strip comprising low melting point solder 7, high melting point solder 6 and flux 11 showing yet another method of bonding the two strips together in which a hole 12 is formed by means of a laser and the areas 13 adjacent to the hole are welded together. A laser such as a pulsed neodymium YAG infrared laser may be used to form an array of holes of about 0.2 to 0.3 mm diameter in the composite strip. In the hole 12 a very thin solder wall 14 is formed that will prevent premature escape of solder flux, but will allow early escape of flux via the hole 12 when the device is heated in use.

FIG. 9 is a schematic isometric view of yet another form of composite solder strip in which a peripheral jacket of low melting point solder 7 has been coextruded about a thin central strip 6 of high melting point solder.

We claim:

1. A device for forming a solder connection between a plurality of elongate bodies, which comprises a dimensionally recoverable article into which part of the bodies can be inverted, the article containing a composite solder strip which comprises a plurality of strips of solder, at least one such strip being formed from a relatively low melting point solder for forming a solder joint between the bodies, and at least one other such strip being formed from a relatively high melting point solder which, when the device is heated in use, will not melt until after the relatively low melting point solder has melted and flowed.

2. A device as claimed in claim 1, wherein the strips of solder are bonded together.

3. A device as claimed in claim 2, wherein the strips of solder are bonded together by means of an adhesive.

4. A device as claimed in claim 2, wherein the strips of solder are bonded together by means of solder.

5. A device as claimed in claim 1, wherein the strips of solder are joined without being bonded together.

6. A device as claimed in claim 1, wherein the strips of solder have been joined by cold working.

7. A device as claimed in claim 6, wherein the strips of solder have been joined by stamping.

8. A device as claimed in claim 6, wherein the strips of solder have been joined by cold rolling.

9. A device as claimed in claim 1, wherein the strips of solder are press fitted together.

10. A device as claimed in claim 1, wherein the composite solder strip is in the form of an annulus.

11. A device as claimed in claim 1, wherein at least one of the strips of solder has been formed only at the same time as the composite solder strip has been formed.

12. A device as claimed in claim 1, wherein the melting point of the higher melting point solder is at least 20° C. higher than that of the low melting point solder.

13. A device as claimed in claim 1, wherein the melting point of the higher melting point solder is at least 40° C. higher than that of the low melting point solder.

14. A device as claimed in claim 1, wherein at least one of the strips of solder is formed from a non-eutectic composition.

* * * * *